(12) United States Patent
Kurz et al.

(10) Patent No.: US 8,564,089 B2
(45) Date of Patent: Oct. 22, 2013

(54) ELECTRONIC FUSE STRUCTURE FORMED USING A METAL GATE ELECTRODE MATERIAL STACK CONFIGURATION

(75) Inventors: Andreas Kurz, Dresden (DE); Christoph Schwan, Dresden (DE); Jan Hoentschel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 96 days.

(21) Appl. No.: 12/941,595

(22) Filed: Nov. 8, 2010

(65) Prior Publication Data

US 2011/0241086 A1    Oct. 6, 2011

(30) Foreign Application Priority Data

Mar. 31, 2010    (DE) .......................... 10 2010 003 555

(51) Int. Cl.
*H01L 23/52*    (2006.01)
(52) U.S. Cl.
USPC .................... 257/529; 257/288; 257/E23.149
(58) Field of Classification Search
USPC ........... 257/209, 528, 529, 665, 288, E23.149
See application file for complete search history.

(56) References Cited

U.S. PATENT DOCUMENTS

| | | | | |
|---|---|---|---|---|
| 6,043,536 A | * | 3/2000 | Numata et al. | 257/347 |
| 8,026,573 B2 | * | 9/2011 | Kuo et al. | 257/529 |
| 2002/0142529 A1 | * | 10/2002 | Matsuda et al. | 438/175 |
| 2003/0234435 A1 | * | 12/2003 | Zimmerman et al. | 257/529 |
| 2005/0285224 A1 | * | 12/2005 | Tsutsui | 257/531 |
| 2007/0004203 A1 | * | 1/2007 | Streck et al. | 438/680 |
| 2007/0170434 A1 | * | 7/2007 | Inoue et al. | 257/72 |
| 2008/0067627 A1 | * | 3/2008 | Boeck et al. | 257/529 |
| 2009/0101989 A1 | * | 4/2009 | Chen et al. | 257/379 |
| 2009/0283840 A1 | * | 11/2009 | Coolbaugh et al. | 257/379 |
| 2010/0019344 A1 | * | 1/2010 | Chuang et al. | 257/516 |
| 2010/0059823 A1 | * | 3/2010 | Chung et al. | 257/355 |
| 2011/0303982 A1 | * | 12/2011 | Chung et al. | 257/363 |
| 2012/0074520 A1 | * | 3/2012 | Yang et al. | 257/529 |

\* cited by examiner

*Primary Examiner* — Bilkis Jahan
(74) *Attorney, Agent, or Firm* — Williams, Morgan & Amerson, P.C.

(57) ABSTRACT

In sophisticated semiconductor devices, electronic fuses may be provided on the basis of a replacement gate approach by using the aluminum material as an efficient metal for inducing electromigration in the electronic fuses. The electronic fuse may be formed on an isolation structure, thereby providing an efficient thermal decoupling of the electronic fuse from the semiconductor material and the substrate material, thereby enabling the provision of efficient electronic fuses in a bulk configuration, while avoiding incorporation of fuses into the metallization system.

17 Claims, 2 Drawing Sheets

ELECTRONIC FUSE STRUCTURE FORMED USING A METAL GATE ELECTRODE MATERIAL STACK CONFIGURATION

BACKGROUND OF THE INVENTION

1. Field of the Invention

The present disclosure generally relates to the field of fabricating integrated circuits, and, more particularly, to electronic fuses in complex integrated circuits that comprise metal gate electrode structures.

2. Description of the Related Art

In modern integrated circuits, a very high number of individual circuit elements, such as field effect transistors in the form of CMOS, NMOS, PMOS elements, resistors, capacitors and the like, are formed on a single chip area. Typically, feature sizes of these circuit elements are steadily decreasing with the introduction of every new circuit generation, to provide currently available integrated circuits with a high performance in terms of speed and/or power consumption. A reduction in size of transistors is an important aspect in steadily improving device performance of complex integrated circuits, such as CPUs. The reduction in size commonly brings about an increased switching speed, thereby enhancing signal processing performance.

In addition to the large number of transistor elements, a plurality of passive circuit elements, such as capacitors and resistors, are typically formed in integrated circuits, as required by the basic circuit layout. Due to the decreased dimensions of circuit elements, not only the performance of the individual transistor elements may be improved, but also their packing density may be significantly increased, thereby providing the potential for incorporating increased functionality into a given chip area. For this reason, highly complex circuits have been developed, which may include different types of circuits, such as analog circuits, digital circuits and the like, thereby providing entire systems on a single chip (SOC).

Although transistor elements are the dominant circuit element in highly complex integrated circuits and substantially determine the overall performance of these devices, other components, such as capacitors, resistors and electronic fuses, also represent essential components, wherein the size of these passive circuit elements may also have to be adjusted with respect to the scaling of the transistor elements in order to not unduly consume valuable chip area. Moreover, the passive circuit elements, such as the resistors, have to be provided with a high degree of accuracy in order to meet tightly set margins according to the basic circuit design. For example, even in substantially digital circuit designs, corresponding resistance values may have to be provided within tightly set tolerance ranges so as to not unduly contribute to operational instabilities and/or enhanced signal propagation delay.

Similarly, electronic fuses may be used in complex integrated circuits as important mechanisms to allow adapting the performance of certain circuit portions to comply with performance of other circuit portions, for instance after completing the manufacturing process and/or during use of the semiconductor device, for instance when certain critical circuit portions may no longer comply with corresponding performance criteria, thereby requiring an adaptation of certain circuit portions, such as re-adjusting an internal voltage supply, thereby re-adjusting overall circuit speed and the like.

For this purpose, the so-called electronic fuses or e-fuses are provided in the semiconductor devices, which represent electronic switches that may be activated once in order to provide a desired circuit adaptation. Hence, the electronic fuses may be considered as having a high impedance state, which typically represents a programmed state, and having a low impedance state, typically representing a non-programmed state of the electronic fuse. Since these electronic fuses may have a significant influence on the overall behavior of the entire integrated circuit, a reliable detection of the non-programmed and the programmed state has to be guaranteed, which is accomplished on the basis of appropriately designed logic circuitry. Furthermore, since typically these electronic fuses may be actuated only once over the lifetime of the semiconductor device under consideration, a corresponding programming activity has to ensure that a desired programmed state of the electronic fuse is reliably generated in order to provide well-defined conditions for the further operational lifetime of the device. The programming of a fuse typically involves the application of a voltage pulse, which in turn induces a current pulse of sufficient current density in order to cause a permanent modification of a specific portion of the fuse. Thus, the electronic behavior of the fuse and the corresponding conductors for supplying the current and voltage to the fuse have to be precisely defined to obtain a reliable programmed state of the fuse. For this purpose, polysilicon is usually used for the fuse bodies, for instance in combination with a metal silicide, in which electromigration effects, in combination with other effects, caused by the current pulse, such as a significant heat generation, may then result in a permanent line degradation, thereby generating a high-ohmic state of the fuse body.

The continuous drive to shrink the feature sizes of complex integrated circuits has resulted in a gate length of field effect transistors of approximately 50 nm and less. A field effect transistor, irrespective of whether an N-channel transistor or a P-channel transistor is considered, typically comprises so-called PN junctions that are formed by an interface located between highly doped regions, referred to as drain and source regions, and a slightly doped or non-doped region, referred to as a channel region, that is disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon forming a conductive channel due to the application of an appropriate control voltage to the gate electrode, depends on, among other things, the distance between the source region and the drain region, which is also referred to as channel length.

Presently, most complex integrated circuits are based on silicon due to the substantially unlimited availability, the well-understood characteristics of silicon and related materials and processes and due to the experience gathered during the last 50 years. Therefore, silicon will likely remain the material of choice for future circuit generations. One reason for the important role of silicon for the fabrication of semiconductor devices has been the superior characteristics of a silicon/silicon dioxide interface that allows a reliable electrical insulation of different regions from each other. The silicon/silicon dioxide interface is stable at high temperatures and, thus, allows high temperature processes to be performed, as are typically required for anneal processes in order to activate dopants and to cure crystal damage without sacrificing the electrical characteristics of the interface. Consequently, in field effect transistors, silicon dioxide has been preferably used as a gate insulation layer which separates the gate electrode, frequently comprised of polysilicon, from the silicon channel region. Upon further device scaling, however, the reduction of channel length may require a corresponding adaptation of the thickness of the silicon dioxide gate dielectric in order to substantially avoid a so-called short channel behavior, according to which a variability in channel length may have a significant influence on the resulting threshold voltage of the transistor. Aggressively scaled transistor devices with a relatively low supply voltage, and thus a reduced threshold voltage, therefore, suffer from a significant increase of the leakage current caused by the reduced thickness of a silicon dioxide gate dielectric.

For this reason, replacing silicon dioxide as the material for gate insulation layers has been considered, particularly for highly sophisticated applications. Possible alternative materials include such materials that exhibit a significantly higher permittivity, so that a physically greater thickness of a correspondingly formed gate insulation layer provides a capacitive coupling that would be obtained by an extremely thin silicon dioxide layer. It has been suggested to replace silicon dioxide with high permittivity materials, such as tantalum oxide, strontium titanium oxide, hafnium oxide, hafnium silicon oxide, zirconium oxide and the like.

Additionally, transistor performance may further be increased by providing an appropriate conductive material for the gate electrode in order to replace the usually used polysilicon material, since polysilicon may suffer from charge carrier depletion at the vicinity of the interface positioned between the gate dielectric material and the polysilicon material, thereby reducing the effective capacitance between the channel region and the gate electrode during transistor operation. Thus, a gate stack has been suggested in which a high-k dielectric material provides enhanced capacitance, while additionally maintaining any leakage currents at an acceptable level. Since the non-polysilicon material, such as titanium nitride and the like, may be formed such that it may be in direct contact with the gate dielectric material, the presence of a depletion zone may thus be avoided, while, at the same time, a moderately high conductivity may be achieved.

As is well known, the threshold voltage of the transistor may depend on the overall transistor configuration, on a complex lateral and vertical dopant profile of the drain and source regions, and the corresponding configuration of the PN junctions, and on the work function of the gate electrode material. Consequently, in addition to providing the desired dopant profiles, the work function of the metal-containing gate electrode material also has to be appropriately adjusted with respect to the conductivity type of the transistor under consideration. For this reason, typically, metal-containing electrode materials may be used for N-channel transistors and P-channel transistors, which may be provided according to well-established manufacturing strategies in a very advanced manufacturing stage. That is, in these approaches, the high-k dielectric material may be formed in combination with an appropriate metal-containing cap layer, such as titanium nitride and the like, followed by the deposition of a polysilicon material, in combination with other materials, if required, which may then be patterned in order to form a gate electrode structure. Concurrently, corresponding resistors may be patterned, as described above. Thereafter, the basic transistor configuration may be completed by forming drain and source regions, performing anneal processes and finally embedding the transistors in a dielectric material. Thereafter, an appropriate process sequence may be performed, in which the top surfaces of the gate electrode structures and all resistive structures, such as fuses, may be exposed and the polysilicon material may be removed. Subsequently, based on a respective masking regime, appropriate metal-containing electrode materials may be filled into gate electrode structures of N-channel transistors and P-channel transistors, respectively, in order to obtain a superior gate structure, including a high-k gate insulating material in combination with a metal-containing electrode material, which may provide an appropriate work function for N-channel transistors and P-channel transistors, respectively. Concurrently, the resistive structures, such as the fuses, may also receive the metal-containing electrode material.

The concept of polysilicon-based electronic fuses in combination with a metal silicide may, thus, no longer be available, which has resulted in the introduction of new approaches for providing electronic fuses in sophisticated semiconductor devices formed on the basis of a replacement gate approach. For example, in some conventional approaches, the active silicon material may be used as an efficient base material for electronic fuses in semiconductor- or silicon-on-insulator (SOI) devices, since crystalline semiconductor material may have similar characteristics in combination with a metal silicide formed therein so as to enable an efficient electromigration effect in the silicon/metal silicide configuration of these electronic fuses. At the same time, the buried insulating material of the SOI configuration may provide a reduced thermal conductivity into the substrate material, thereby providing a desired thermal effect upon programming electronic fuses, since the significant heat generation may represent an important aspect upon permanently "damaging" the fuse body of the semiconductor-based electronic fuse.

In other conventional approaches, the metallization system of the complex semiconductor devices is used as a material system for forming therein metal-based electronic fuses, wherein, typically, a three-dimensional configuration of the electronic fuses may be accomplished by using vias and metal lines in order to generate a desired line degradation on the basis of electromigration. Typically, in sophisticated semiconductor devices, the metallization systems are provided on the basis of a highly conductive metal, such as copper, frequently in combination with sophisticated dielectric materials, such as so-called low-k dielectric materials having a dielectric constant of 3.0 and significantly less. These low-k dielectric materials may typically be provided in the form of porous materials having a reduced mechanical strength due to the reduced density of the material. Owing to the per se desirable high conductivity of the copper material, however, a desired permanent modification of the initial conductivity may require relatively high current densities in the electronic fuse in order to obtain the desired electromigration effect, which may thus result in the desired high ohmic state or programmed state of the electronic fuse. Furthermore, an appropriate generation of heat in and at the electronic fuse may also require reduced cross-sectional areas and/or an increased overall length of the electronic fuse, which may thus result in increased space consumption within the complex metallization system. Moreover, due to the required high current densities, which in turn may require a high current pulse for given lateral dimensions of the vias and metal lines of the electronic fuse, the peripheral circuitry for the electronic fuse, in particular the transistors for providing the programming current pulse, may also have to be provided with increased transistor width, which may thus also contribute to increased area consumption in the device level of the semiconductor device. Additionally, the electromigration of copper in the electronic fuses may result, owing to the reduced mechanical strength and density of the sophisticated dielectric materials, in a significant extrusion of copper material, which may possibly not be efficiently prevented by the standard conductive barrier materials provided in the metal lines and vias of the regular metal features in the metallization system. Since copper readily diffuses in a plurality of dielectric materials, such as silicon dioxide, and, in particular, in low-k dielectric materials, a reliable confinement of copper has to be guaranteed in order to avoid copper migration to sensitive device areas, which may otherwise result in significant modification of the overall device performance or which may even result in a total failure of the semiconductor device. Consequently, additional barrier materials, such as dielectric materials, may have to be provided for sophisticated metal fuses, which may also contribute to additional process complexity.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure generally provides semiconductor devices and manufacturing techniques in which electronic fuses may be formed in a semiconductor device with a high degree of compatibility with sophisticated replacement gate approaches, wherein the metal-containing conductive electrode materials may be efficiently used as basic materials for the electronic fuses. It has been recognized that electronic fuses may be appropriately embedded into a dielectric material having a desired low heat conductivity so as to obtain a desired efficient electromigration effect on the basis of metal-containing electrode materials, which may be used for forming sophisticated high-k metal gate electrode structures. For example, electromigration may occur in aluminum at significantly lower current densities compared to the highly conductive copper material, which is typically used in the metallization system of sophisticated semiconductor devices, so that electronic fuses may be provided in the device level of the semiconductor device on the basis of a replacement gate approach, while nevertheless resulting in a reliable programming activity, while at the same time the required space consumption in the device level may be significantly less compared to conventional strategies for providing the electronic fuses in the metallization system on the basis of a copper material. In some illustrative embodiments disclosed herein, the electronic fuse may be formed on an isolation region, which may have a significantly reduced heat conductivity compared to the actual semiconductor material in the device level, thereby enabling the provision of electronic fuses in bulk architectures, without being restricted to SOI configurations, which are typically used in other conventional strategies, when electronic fuses are to be provided in the device level on the basis of a replacement gate approach. Moreover, the dielectric material of the contact level may also efficiently confine or enclose the electronic fuses, thereby providing superior temperature conditions during the programming activity, while also any metal extrusion during the electromigration of the electrode material may be efficiently suppressed without requiring any additional materials or process steps. The electromigration effects of aluminum are well known in the art, since aluminum has been and is still used as metallization systems of less sophisticated semiconductor devices, so that appropriate lateral dimensions of electronic fuses based on aluminum may be readily determined so as to obtain a reliable performance of the electronic fuses.

One illustrative semiconductor device disclosed herein comprises a transistor element comprising a gate electrode structure, which in turn comprises a gate insulation layer formed of a high-k gate dielectric material. The gate electrode structure further comprises a gate electrode formed of a metal-containing electrode material, which comprises aluminum. The semiconductor device further comprises an electronic fuse comprising the high-k dielectric material and the metal-containing electrode material.

A further illustrative semiconductor device disclosed herein comprises an electronic fuse formed on an isolation region that is laterally embedded in a semiconductor layer of the semiconductor device. The electronic fuse comprises at least one conductive metal-containing non-aluminum layer and an aluminum layer formed on the at least one conductive metal-containing non-aluminum layer.

One illustrative method disclosed herein relates to forming an electronic fuse of a semiconductor device. The method comprises forming a layer stack above a first device region and a second device region of the semiconductor device, wherein the layer stack comprises a dielectric material and a semiconductor material. Additionally, the method comprises forming a gate electrode structure above the first device region and a fuse body above the second device region from the layer stack. Moreover, a top surface of the semiconductor material is exposed and the semiconductor material is replaced with a metal-containing electrode material that comprises an aluminum layer.

BRIEF DESCRIPTION OF THE DRAWINGS

The disclosure may be understood by reference to the following description taken in conjunction with the accompanying drawings, in which like reference numerals identify like elements, and in which.

Figure 1A:
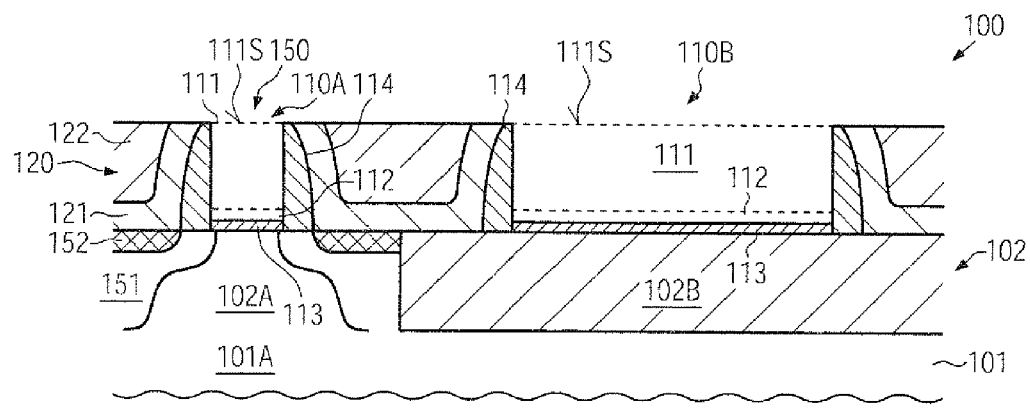
FIGS. 1a-1b schematically illustrate a cross-sectional view of a semiconductor device including a transistor and an electronic fuse formed on the basis of a replacement gate approach, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides semiconductor devices and manufacturing techniques in which aluminum-based electrode materials, as may be used for replacement gate approaches, may be efficiently incorporated in electronic fuses, which may be formed in the device level of sophisticated semiconductor devices. That is, the electronic fuses may be provided on the basis of substantially the same configuration as sophisticated high-k metal gate electrode structures, wherein an isolation region, such as a shallow trench isolation, may provide a thermal decoupling of the electronic fuse from the active semiconductor material and the substrate material in bulk configurations, thereby providing a high degree of flexibility in selecting an appropriate semiconductor configuration. In other words, the electronic fuses may be provided for bulk configurations, i.e., for configurations in which the semiconductor material of transistors may directly connect to the crystalline semiconductor material of the substrate, while, in other cases, the principles disclosed herein may be applied in the context of SOI configurations, while, however, avoiding the incorporation of electronic fuses into the active semiconductor material. Moreover, since the electronic fuses may be provided on the basis of substantially the same basic configuration as the high-k metal gate electrode structures, the electronic fuses are reliably embedded in the dielectric material of the contact level of the semiconductor device, which may thus provide superior thermal conditions upon programming the electronic fuse. At the same time, typically, the dielectric material of the contact level may be provided with superior density and strength, for instance compared to the low-k dielectric material of sophisticated metallization systems, thereby ensuring superior performance of the electronic fuses, for instance in terms of metal extrusion and the like, upon inducing an electromigration effect, without requiring any additional materials or process steps. Moreover, aluminum in combination with other metal-containing electrode materials, such as titanium nitride, tantalum nitride, work function adjusting species and the like, may have a reduced conductivity compared to copper-based metal features, while the electromigration defect in aluminum is more pronounced for a given current density compared to copper, thereby enabling reduced overall dimensions of the electronic fuses and also of any peripheral transistor elements for supplying the current pulse or pulses for programming the electronic fuses.

FIG. 1a schematically illustrates a cross-sectional view of a semiconductor device 100 comprising a substrate 101 and a semiconductor layer 102, at least in an initial state, wherein the substrate 101 and the semiconductor layer 102 may form a bulk configuration. That is, the semiconductor layer 102 may comprise a plurality of semiconductor regions or active regions, which may be laterally delineated by appropriate isolation structures, for instance comprised of any appropriate dielectric materials, such as silicon dioxide, silicon nitride and the like. For convenience, a single active or semiconductor region 102A is illustrated, which may be formed laterally adjacent to an isolation region 102B. In a bulk configuration, the semiconductor material of the active region 102A may directly connect to a crystalline semiconductor material, such as a silicon material, of the substrate 101. Thus, in this case, the semiconductor layer 102 in its initial state may represent an upper portion of the crystalline substrate material 101A. The isolation region 102B may thus be formed in the semiconductor layer 102 so as to extend to any desired depth in accordance with overall device requirements. In other illustrative embodiments (not shown), the semiconductor device 100 may represent an SOI configuration, in which a buried insulating material (not shown) may be formed below the semiconductor layer 102 and thus below the active region 102A and the isolation region 102B, thereby providing a boundary with respect to the substrate material 101A.

The semiconductor material of the layer 102 and also the crystalline semiconductor material 101A may typically have a moderately high heat conductivity, for instance of approximately 150 W/mK, which may be advantageous in dissipating heat from temperature critical device areas, such as the active region 102A, into the substrate 101. On the other hand, the isolation region 102B may have a significantly reduced heat conductivity, for instance approximately 1.2-1.4 W/mK, which may thus provide superior thermal conditions for an electronic fuse 110B formed on the isolation region 102B.

Moreover, in the manufacturing stage shown, the semiconductor device 100 may comprise a transistor 150 including drain and source regions 151 provided in the active region 102A possibly in combination with metal silicide regions 152, depending on the overall process and device requirements. The transistor 150 may further comprise a gate electrode structure 110A, which may have basically the same configuration in terms of materials as the electronic fuse 110B. In the embodiment shown, the gate electrode structure 110A and the electronic fuse 110B may comprise a dielectric material 113, such as a conventional dielectric material, for instance in the form of silicon dioxide, silicon oxynitride, silicon nitride and the like. In other illustrative embodiments, the layer 113 may represent the gate insulation layer of the gate electrode structure 110A and may comprise, in this manufacturing stage, a high-k dielectric material, such as hafnium oxide, zirconium oxide, nitrogen-enriched metal oxides and the like. Furthermore, if the gate insulation layer 113 comprises a sensitive high-k dielectric material, a metal-containing electrode material 112 may be provided so as to reliably confine the gate insulation layer 113 in the gate electrode structure 110A and thus also in the electronic fuse 110B. For example, the metal-containing layer 112 may comprise titanium nitride and the like, possibly in combination with a work function adjusting species, such as lanthanum, aluminum and the like, depending upon the process strategy. Furthermore, the gate electrode structure 110A and the electronic fuse 110B may initially comprise a semiconductor material, as indicated by the dashed line and denoted as 111, which may be considered as a placeholder material and which may be replaced by any appropriate metal-containing electrode materials in combination with aluminum, as is also discussed above. Furthermore, the structures 110A, 110B may comprise a sidewall spacer structure 114 having any appropriate configuration, such as one or more spacer elements, possibly in combination with etch stop liners, and the like. For example, the spacer structure 114 may comprise any appropriate dielectric materials in the form of silicon nitride, silicon dioxide, amorphous carbon and the like.

Additionally, in the manufacturing stage shown, a portion of a contact level 120 may be provided, for instance in the form of any appropriate dielectric materials, such as a dielectric layer 121 in combination with a dielectric layer 122, which may be provided in the form of a silicon nitride material and a silicon dioxide material, respectively, and the like. Thus, the dielectric material of the contact level 120, for instance the materials 121, 122, may laterally enclose the structures 110A, 110B, thereby providing, in particular for the electronic fuse 110B, enhanced thermal conditions, since these materials may also provide reduced heat conductivity, which may be advantageous when operating the electronic fuse 110B, as described above. Furthermore, the materials 121, 122, in combination with the sidewall spacer structure 114, may provide an efficient confinement of any metals in the electronic fuse 110B when inducing a significant electromigration effect therein.

The semiconductor device 100 as illustrated in FIG. 1a may be formed on the basis of the following processes. The isolation structure 102B may be formed in the semiconductor layer 102 by using well-established process techniques, such as sophisticated lithography, etch processes, deposition processes, planarization processes and the like. Prior to or after forming the isolation structure 102B, the active region 102A may receive appropriate well dopant species as required for forming the transistor 150. Next, one or more appropriate materials for the gate insulation layer 113 may be provided, for instance in the form of a conventional dielectric material, possibly including an oxidation process, in which case, the growth of a corresponding dielectric material on the isolation structure 102B may be suppressed. In other cases, any dielectric materials may be formed by deposition techniques, such as chemical vapor deposition (CVD) and the like, wherein, in some illustrative embodiments, the gate insulation layer 113 may receive a high-k dielectric material, which may be accomplished by depositing a desired material composition, such as hafnium oxide, zirconium oxide and the like. Moreover, the cap layer 112, if required, may be formed, for instance, in the form of a titanium nitride material and may act as a conductive cap layer so as to confine a high-k dielectric material in the gate insulation layer 113. Consequently, in some replacement gate approaches, the high-k dielectric material or the gate insulation layer 113 may be provided in an early manufacturing stage and may be confined by the cap layer 112 in combination with the spacer structure 114, or at least a portion thereof, while other metal species for adjusting the work function of the gate electrode structure 110A may be provided in a later manufacturing stage. In other illustrative embodiments, the high-k dielectric material for the gate insulation layer 113 may be provided in a later manufacturing stage or the material of the layer 113 may also be removed, at least partially, in a later manufacturing stage. In still other illustrative embodiments, the gate insulation layer 113 may include the high-k dielectric material and the layer 112 and/or the gate insulation layer 113 may further comprise an appropriate work function adjusting species, such as lanthanum, aluminum and the like, in order to achieve the desired work function for the gate electrode structure 110A in an early manufacturing stage, while, on the other hand, any further highly conductive electrode metals, such as aluminum, may be provided in a later manufacturing stage.

After providing the layer 113 and possibly the layer 112, the semiconductor material 111 may be formed, possibly in combination with other materials, such as a dielectric cap layer (not shown), any hard mask materials and the like, as is required for the patterning of the resulting layer stack. To this end, sophisticated lithography techniques may be applied in combination with etch processes in order to form the gate electrode structure 110A with a desired gate length of, for instance, 50 nm and less, while the electronic fuse 110B may also be provided with appropriate lateral dimensions, which may be selected such that a desired electromigration effect and heat generation may be accomplished so as to obtain a reliable high ohmic state upon programming the electronic fuse 110B during operation and/or during the adjustment of the final characteristics of the semiconductor device 100 after completing the manufacturing process. It should be appreciated that appropriate lateral dimensions for a given height of the structures 110A, 110B may be readily determined on the basis of experiments, know-how and the like based on data and experiments that are available for well-established metals, such as aluminum. For example, a width of the electronic fuse 110B, i.e., in FIG. 1a, a lateral dimension that is perpendicular to the drawing plane of FIG. 1a, may have a similar size as a length of the gate electrode structure 110A, if a reduced cross-sectional area is considered advantageous for the electronic fuse 110B in order to obtain a high current density for a given maximum current to be applied during the programming of the electronic fuse 110B. On the other hand, a length of the electronic fuse 110B, i.e., the horizontal extension of one of the layer 113, 112, 111 between the dielectric spacer structure 114 in FIG. 1a, may be selected so as to comply with the contact regime still to be provided and the overall resistivity of the electronic fuse 110B.

After patterning the structures 110A, 110B, the sidewall spacer structure 114 may be provided in two or more different steps, while also, intermittently, dopant profiles of the drain and source regions 151 may be established on the basis of any appropriate process strategy. After performing any anneal cycles, the metal silicide regions 152 may be formed on the basis of any silicidation techniques, wherein, if required, the semiconductor material 111 may still be masked by an appropriate dielectric material. Thereafter, the one or more dielectric materials of the contact level 120 may be formed, for instance by any appropriate deposition technique, such as plasma-enhanced CVD, sub-atmospheric CVD and the like, possibly followed by a planarization process. Thereafter, the material 111 may be exposed, by exposing or providing a top surface 111S, through which at least the material 111 may be removed by applying any appropriate selective etch processes. As indicated above, the material 112, if provided, may act as an efficient etch stop material, while, in other cases, the material 113 may act as an etch stop material and may also be removed, at least partially, if a high-k dielectric component is still to be provided in the structures 110A, 110B. Thereafter, the further processing may be continued by at least replacing the material 111 with at least an aluminum material.

Figure 1B:
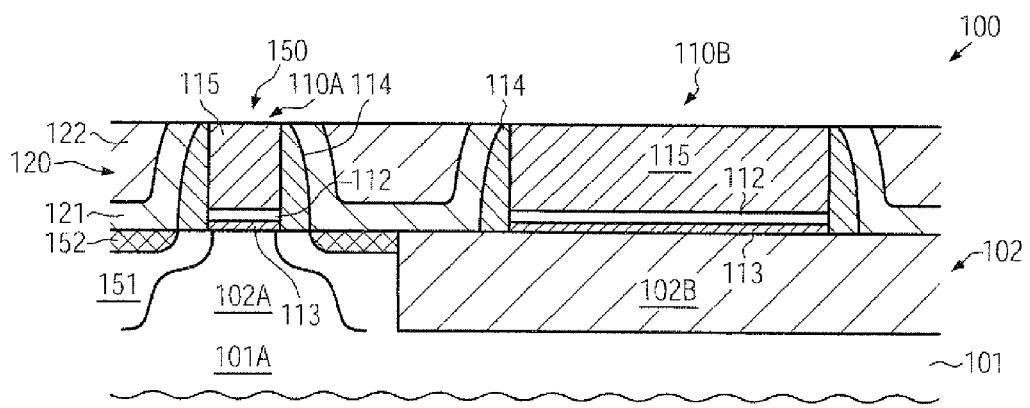

FIG. 1b schematically illustrates the semiconductor device in a further advanced manufacturing stage, according to illustrative embodiments in which the materials 113 and 112 may be provided in an early manufacturing stage such that the electronic characteristics of the gate electrode structure 110A, such as work function and the like, have been established, for instance by providing an appropriate work function adjusting metal species in the layer 113 and/or the layer 112. For example, lanthanum may be incorporated in one or both of these layers or may be provided as a separate material layer. Furthermore, an electrode metal layer 115, in the form of an aluminum material, may be provided in the gate electrode structure 110A and the electronic fuse 110B, which may be accomplished on the basis of any appropriate deposition techniques. If required, prior to the deposition of the aluminum material 115, one or more additional metal-containing material layers may be deposited, as will be described later on in more detail. Any excess material of the aluminum layer 115 may be removed, for instance by chemical mechanical polishing (CMP) and the like.

Figure 1C:
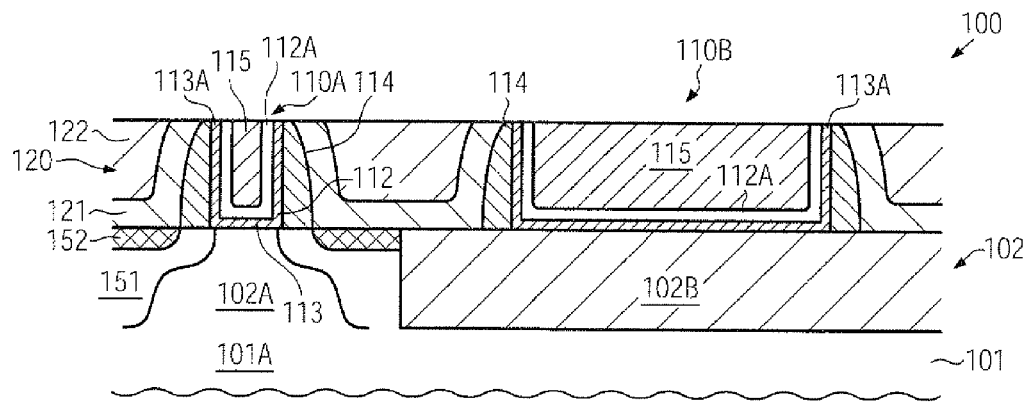
FIG. 1c schematically illustrates a cross-sectional view of the semiconductor device according to further illustrative embodiments, in which the metal-containing electrode materials including an aluminum layer may be laterally confined by a high-k dielectric material in the gate electrode structure and the electronic fuse.

FIG. 1c schematically illustrates the semiconductor device 100 according to further illustrative embodiments, in which a dielectric material 113A may be formed on sidewalls and also on the bottom of the gate electrode structure 110A and the electronic fuse 110B. For example, the dielectric material 113A may represent a high-k dielectric material, which may be deposited after removing at least the semiconductor material 111 (FIG. 1a), wherein, depending on the overall process strategy, any other material, such as the dielectric material 113 (FIG. 1a) may also be removed, at least partially, in order to obtain a desired overall dielectric constant for the gate electrode structure 110A. Furthermore, a metal-containing material layer 112A may be formed on the dielectric material 113A and may be comprised of any appropriate material, such as titanium nitride, tantalum nitride and the like, wherein the layer 112A may represent a layer system including two or more sub-layers (not shown), one of which may comprise an appropriate work function adjusting species, such as lanthanum and the like. Moreover, the layer or layer system 112A may comprise a conductive etch stop or barrier material, for instance in the form of tantalum nitride, which may be required for removing any non-wanted material layers from other gate electrode structures, in which a different type of layer system may be appropriate for adjusting the final electronic characteristics of the gate electrode structures. By providing a plurality of non-aluminum materials, such as the layer 112A or the layer 112 in FIG. 1b, a reduction in overall conductivity may be achieved, since typically the material or material system 112A may have a reduced conductivity compared to the aluminum layer 115. In this case, generally, a reduced length of the electronic fuse 110B may be used, thereby still obtaining the desired heat generation caused by the inferior conductivity of the material or material system 112A.

With respect to providing the materials 113A, 112A and 115, any appropriate deposition techniques may be applied, followed by any material removal processes.

Figure 1D:
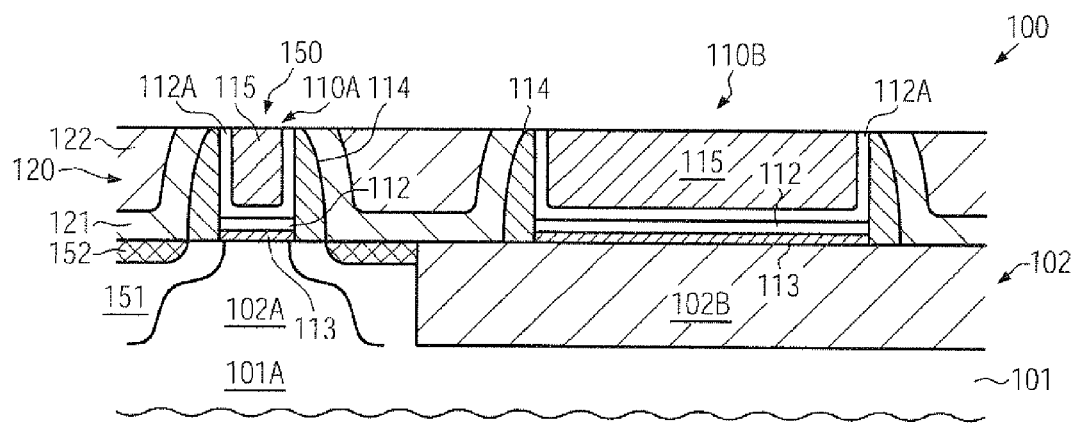
FIG. 1d schematically illustrates a cross-sectional view of the semiconductor device according to further illustrative embodiments, in which the aluminum layer of the electronic fuse may be laterally embedded by at least one non-aluminum material layer.

FIG. 1d schematically illustrates the semiconductor device 100 according to illustrative embodiments in which at least the gate insulation layer 113 may have been provided in an early manufacturing stage and may comprise a high-k dielectric material. In the embodiment shown, at least a portion of the material layer 112 may have been preserved during the preceding process sequence, while at least one further non-aluminum material layer, such as the layer 112A or layer system, may be provided so as to also be formed on sidewalls of the gate electrode structure 110A and the electronic fuse 110B. Thus, the material 112A may laterally confine the aluminum layer 115. It should be appreciated that, in other illustrative embodiments, the material 112A may be directly formed on the gate insulation layer 113, if the material 112 has been removed. Moreover, the layer 112A or layer system may comprise any appropriate materials for adjusting the work function and/or for providing any barrier effect, as required for the processing of the device 100. Also, in this case, the provision of the materials 112 and 112A may reduce overall conductivity in the electronic fuse 110B, thereby enabling reduced lateral dimensions, as indicated above.

Figure 1E:
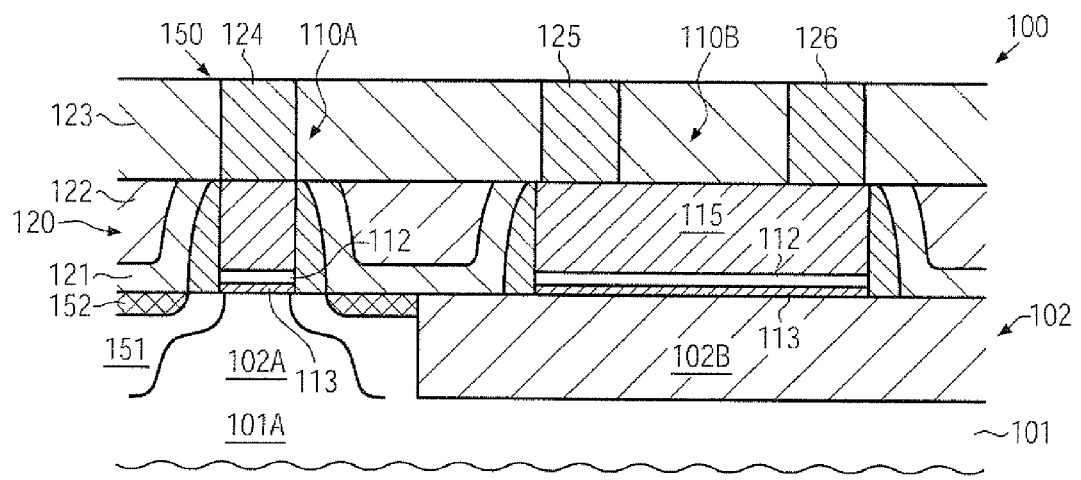
FIG. 1e schematically illustrates a cross-sectional view of the semiconductor device in a further advanced manufacturing stage, in which a contact level may be provided so as to connect to the electronic fuse, according to illustrative embodiments.

FIG. 1e schematically illustrates the semiconductor device 100 in a further advanced manufacturing stage. As illustrated, the contact level 120 of the device 100 may be completed and may thus comprise an additional dielectric material 123, for instance in the form of silicon dioxide and the like, which may thus efficiently confine the gate electrode structure 110A, and in particular the electronic fuse 110B, which may now be thermally decoupled on the basis of the isolation structure 102B, the materials 121 and 122 and the additional dielectric material 123. Furthermore, one or more contact elements 124 may be provided in the contact level 120 so as to connect to the transistor 150, wherein, for convenience, a single contact element 124 is illustrated, which may connect to the gate electrode structure 110A. Similarly, contact elements 125, 126 may be provided so as to connect to the electronic fuse 110B, wherein the contact elements 125, 126 may have any appropriate geometric configuration so as provide a desired low contact resistivity in order to supply the appropriate current to the electronic fuse 110B in order to induce electromigration, in particular in the material 115, which may be efficiently assisted by the efficient thermal confinement of the electronic fuse 110B.

The dielectric material 123 and the contact elements 124, 125, 126 may be provided on the basis of any desired process strategy, for instance by depositing the material 123 using any desired deposition technique, followed by the patterning of the dielectric material 123 for the contact elements 124, 125, 126 and by patterning the dielectric materials 121, 122 for any other contact elements which may connect to the active region 102A (not shown). The patterning may be realized on the basis of hard mask materials and the like, in combination with sophisticated lithography techniques. Thereafter, the resulting openings may be filled with any appropriate material or materials, such as tungsten, possibly in combination with barrier and/or seed layers, and the like, while, in other cases, other materials, such as aluminum and the like, may be efficiently used.

Figure 1F:
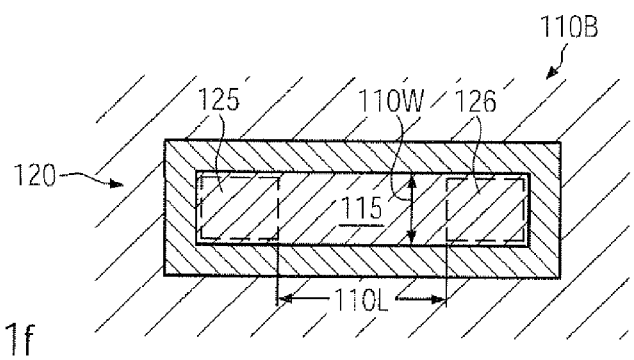
FIG. 1f schematically illustrates a top view of the electronic fuse according to illustrative embodiments.

FIG. 1f schematically illustrates a top view of the electronic fuse 110B, wherein it may be assumed that at least the material 123 and the contact elements 125, 126 (FIG. 1e) are transparent. As illustrated, the actual effective length, indicated by 110L, of the fuse 110B may be defined by the length of the material 115 positioned between the contact elements 125, 126. In other words, within the length 110L, the current flow established during programming the electronic fuse 110B may create electromigration effects, which are assisted by the significant local heat generation with the length 110L, thereby inducing a permanent "damaging" and thus modification of the overall electronic state of the fuse 110B, which may be reliably detected by any peripheral circuitry (not shown) connected to the fuse 110B, for instance via the contact elements 125, 126 and a corresponding metallization system (not shown) to be formed above the contact level 120. Similarly, an effective width 110W, which may represent the width of any conductive material without the width of the spacer structure, may be selected so as to obtain the desired high current density for a given height of the fuse 110B and may be on the order of magnitude of the length of gate electrode structures, such as the gate electrode structure 110A as shown in FIG. 1e. It should be appreciated that the electronic fuse 110B may have any appropriate geometric configuration, for instance a plurality of linear portions or curved portions may be provided so as to increase the effective length 110L, if considered appropriate. Furthermore, increased contact areas (not shown) may be provided so as to connect to the contact elements 125, 126 which may then have an increased size, or wherein two or more contact elements may be used for each of the contact elements 125, 126 in order to enhance the overall current drive capability.

As a result, the present disclosure provides semiconductor devices and manufacturing techniques in which electronic fuses may be formed in the device level of the semiconductor device together with high-k metal gate electrode structures, wherein the aluminum-based electrode material may provide superior electromigration effects compared to highly conductive copper materials, as may be typically used in conventional strategies when providing the electronic fuses in the metallization system of the semiconductor device. Furthermore, a very efficient thermal confinement of the electronic fuse may be accomplished by forming the electronic fuse on or above an isolation region, while the dielectric material of the contact level may then provide an efficient lateral confinement while also covering the top of the electronic fuse.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device, comprising:
a transistor element comprising a gate electrode structure, said gate electrode structure being formed above a first device region and comprising a gate material stack, said gate material stack consisting of an insulating material layer and a plurality of conductive material layers positioned above said insulating material layer, wherein said material layers of said gate material stack are arranged in a gate stack layered arrangement, said insulating material layer comprising a high-k dielectric material and said plurality of material layers comprising a metal-containing electrode material and at least one non-aluminum conductive material layer, said metal-containing electrode material comprising aluminum; and
an electronic fuse comprising an electronic fuse material stack formed above a second device region, said electronic fuse material stack consisting of the same material layers as are present in said gate material stack, wherein said same material layers in said electronic fuse material stack are arranged in a same layered arrangement as said gate stack layered arrangement and wherein at least said non-aluminum conductive material layer is formed on dielectric sidewalls of said electronic fuse so as to laterally confine said aluminum comprising said metal-containing electrode material of said electronic fuse.

2. The semiconductor device of claim 1, wherein said first device region comprises a semiconductor region that is directly connected to a crystalline semiconductor material of a substrate of said semiconductor device.

3. The semiconductor device of claim 1, wherein said second device region has a lower heat conductivity than said first device region.

4. The semiconductor device of claim 1, wherein said second device region comprises an isolation region embedded in a semiconductor material.

5. The semiconductor device of claim 1, wherein both of said insulating material layer and said at least one non-aluminum conductive material layer are formed on said dielectric sidewalls of said electronic fuse so as to laterally confine said aluminum of said metal-containing electrode material of said electronic fuse.

6. The semiconductor device of claim 1, wherein said at least one non-aluminum conductive material layer and said aluminum form a layer stack that extends between a sidewall spacer structure so as to directly connect to said sidewall spacer structure.

7. The semiconductor device of claim 1, wherein said at least one non-aluminum conductive material layer comprises a titanium nitride layer.

8. The semiconductor device of claim 1, wherein said gate electrode structure has a gate length of approximately 50 nm or less.

9. The semiconductor device of claim 1, further comprising a contact level comprising a dielectric material formed laterally adjacent to and above said electronic fuse and said gate electrode structure, wherein said contact level further comprises contact elements so as to connect to said gate electrode structure and said electronic fuse.

10. The semiconductor device of claim 1, wherein said metal-containing electrode material comprises a metal species for adjusting a work function of said gate electrode structure.

11. The semiconductor device of claim 10, wherein said metal species comprises lanthanum.

12. A semiconductor device, comprising:
an electronic fuse formed on an isolation region that is laterally embedded in a semiconductor layer, said electronic fuse comprising an electronic fuse material stack formed above said isolation region, wherein said electronic fuse material stack comprises at least one conductive metal-containing non-aluminum layer and an aluminum layer formed on said at least one conductive metal-containing non-aluminum layer, wherein either of said aluminum layer and said at least one conductive metal-containing non-aluminum layer comprises a substantially vertical portion formed adjacent to dielectric sidewalls of said electronic fuse; and
a transistor comprising a metal gate electrode structure, said metal gate electrode structure being formed above said semiconductor layer and comprising a metal gate electrode material stack that is the same as said electronic fuse material stack.

13. The semiconductor device of claim 12, wherein said at least one conductive metal-containing non-aluminum layer has an internal stress level of 1 Giga Pascal (GPa) or higher.

14. The semiconductor device of claim 12, wherein said electronic fuse further comprises a plurality of contact elements in conductive contact with said electronic fuse material stack.

15. The semiconductor device of claim 12, where said electronic fuse further comprises a high-k dielectric material formed at least between said at least one conductive metal-containing non-aluminum layer and said isolation region.

16. The semiconductor device of claim 15, wherein either of said high-k dielectric material and said at least one conductive metal-containing non-aluminum layer of said electronic fuse comprises a work function metal species for adjusting a work function of said gate electrode structure of said transistor.

17. A semiconductor device, comprising:
   a transistor element comprising a gate electrode structure, said gate electrode structure comprising a gate insulation layer formed of a high-k gate dielectric material and a gate electrode formed of a metal-containing electrode material, said metal-containing electrode material comprising aluminum and at least one conductive non-aluminum material layer; and
   an electronic fuse comprising said high-k dielectric material and said metal-containing electrode material, wherein said high-k dielectric material and said at least one conductive non-aluminum material layer are formed on dielectric sidewalls of said electronic fuse so as to laterally confine at least said aluminum comprising said metal-containing electrode material.

* * * * *